(12) United States Patent
Breeuwer

(10) Patent No.: US 7,415,142 B2
(45) Date of Patent: Aug. 19, 2008

(54) METHOD OF VISUALIZING THE PERFUSION OF AN ORGAN WHILE UTILIZING A PERFUSION MEASUREMENT

(75) Inventor: Marcel Breeuwer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1000 days.

(21) Appl. No.: 10/014,184

(22) Filed: Dec. 11, 2001

(65) Prior Publication Data

US 2002/0095086 A1 Jul. 18, 2002

(30) Foreign Application Priority Data

Dec. 15, 2000 (EP) .................................. 00204601

(51) Int. Cl.
*G06K 9/00* (2006.01)
(52) U.S. Cl. ...................................... 382/128
(58) Field of Classification Search ............. 382/128, 382/130, 131, 276, 278–296
See application file for complete search history.

(56) References Cited

U.S. PATENT DOCUMENTS

| 5,803,914 | A | * | 9/1998 | Ryals et al. | 600/407 |
| 5,850,486 | A | * | 12/1998 | Maas et al. | 382/294 |
| 5,860,931 | A | * | 1/1999 | Chandler | 600/458 |
| 5,970,182 | A | * | 10/1999 | Goris | 382/278 |
| 6,447,450 | B1 | * | 9/2002 | Olstad | 600/437 |
| 6,718,055 | B1 | * | 4/2004 | Suri | 382/128 |

OTHER PUBLICATIONS

Cesmeli et al.: "An automated temporal alignment technique for the translation and rotational correction of digital radiographic images of Bjork-Shiley heart valves," Proceedings Of The Computers In cardiology Conference. London, Sep. 5-8, 1993, Los Alamitos, IEEE Comp. SOC. Press, US, May 9, 1993, pp. 619-622.

* cited by examiner

*Primary Examiner*—Tom Y Lu

(57) ABSTRACT

The invention relates to a method of visualizing the perfusion of an organ, notably the perfusion of the myocardium of the heart. A series of MR perfusion images is displayed on a visual display unit. Each pair of successive images from a series of images is transformed in such a manner that the organ that is shown on the display unit essentially maintains its position.

12 Claims, 4 Drawing Sheets

METHOD OF VISUALIZING THE PERFUSION OF AN ORGAN WHILE UTILIZING A PERFUSION MEASUREMENT

The invention relates to a method of visualizing the perfusion of an organ, notably the myocardium of a patient, while utilizing a perfusion measurement, in which method a series of images of the organ that has been acquired by way of the perfusion measurement is displayed on a display device so as to be visually inspected.

A method of this kind is known from practice and is based on the use of, for example the MR perfusion measuring technique. In order to obtain reliable images, it is desirable that the patient undergoing the examination is immobilized as well as possible on an examination table and moves as little as possible during the actual perfusion measurement. The perfusion measurement itself is initiated by injection of a contrast liquid that facilitates the perfusion measurement and enables the reproduction of images wherefrom the perfusion of the organ can be deduced.

A problem encountered during such a known perfusion measurement is that the patient moves during the measurement or cannot hold his or her breath, so that the position of the organ being measured changes. The analysis of the perfusion behavior of the organ examined is thus impeded, because in that case the intensity variation of the injected contrast liquid in successive images cannot be compared very well.

It is an object of the invention to solve this problem; to this end, according to the invention it is proposed to perform a transformation operation on every pair of successive images from the series of images of the organ in such a manner that, subsequent to the transformation, the organ will be displayed essentially in a fixed position after completion of the transformation operation.

A first version of the method in accordance with the invention that can be implemented very well is characterized in that the first image in time serves as a reference base and that each of the subsequent images is transformed so as to minimize differences between each of these images and the reference base.

An alternative version that is to be preferred, however, is characterized in that the first image in time of every pair of successive images serves as a reference base and that the subsequent second image is transformed so as to minimize differences between said second image and the reference base. This version yields a stable image in which comparatively small variations that occur during a practical perfusion measurement can be suitably tracked, so that the series of images presented for visual inspection enables very adequate analysis of the perfusion behavior of the organ being examined.

It is desirable that the transformation operation is composed of a rotation operation and a translation operation that are performed on the image so as to) avoid that complex compression operations or other operations are performed on the image of the organ being examined.

In conformity with a further aspect of the invention the method is characterized in that prior to the transformation operation there is determined a reference region in the image that constitutes the reference base and in the subsequent image, and that the transformation operation is determined by minimizing the differences in the reference region of successive images. The perfusion behavior of the organ being examined can thus be suitably visualized while other, less important parts of the image are subject to a displacement, for example due to the patient's respiration. In order to achieve the foregoing, it is particularly desirable that the reference region is bounded by the immediate vicinity of the organ being examined.

It is an important further aspect of the invention that the transformation operation as determined by means of the reference region is performed on the entire image.

An image that has been subjected to the complete transformation operation can thus advantageously serve as a reference base for a subsequent image, because the transformation operation ensures that no voids arise at the edges of the reference region of the transformed image.

The invention also relates to a data processing system as defined in claim 8.

The data processing system of the invention is arranged to carry out the method of the invention.

The invention also relates to a computer program as claimed in claim 9. The computer program according to the invention can be loaded into the working memory of a data processing system, so that the data processing system can carry out the method of the invention.

Preferably, the computer program of the invention may be made available from a data carrier, such as a CD rom disk. The computer program may also be downloaded from a data network such as the 'world-wide wel'.

The invention will be described in detail hereinafter on the basis of non-limitative examples of a preferred version of the method in accordance with the invention and with reference to the following drawing FIGS. 1-4.

Each time a pair of successive images is selected from a number of images (which number is known or not) that are arranged in series, for example the image $B_{i-1,r}$ and the subsequent image $B_{i,o}$. The image $B_{i-1,r}$ bears the sequence number i−1 and is formed from an image $B_{i-1,o}$ that concerns the actual exposure of the organ being examined wherefrom the image has been acquired. Transformation of this image $B_{i-1,o}$ in conformity with the method of the invention to be described in detail hereinafter yields the transformed image $B_{i-1,r}$. A reference region $ROI_{i-1}$ is defined in the image $B_{i-1,r}$. This operation can be performed manually or automatically. The organ being examined should be situated completely within the region that is indicated by the reference $ROI_{i-1}$; the boundary of the reference region $ROI_{i-1}$ that is denoted by the dashed line marks the immediate vicinity of the organ being examined.

Figure 1:
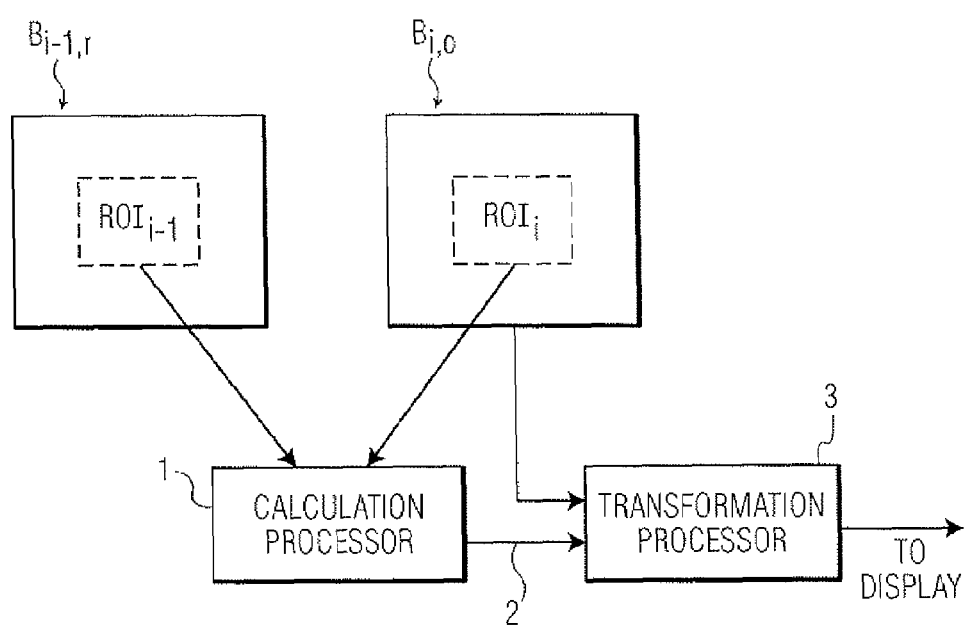
FIG. 1 is a pictorial representation of a process of the invention, where a pair of time successive images are processed to calculate transformation parameters and to implement transformation parameters.
Figure 2:
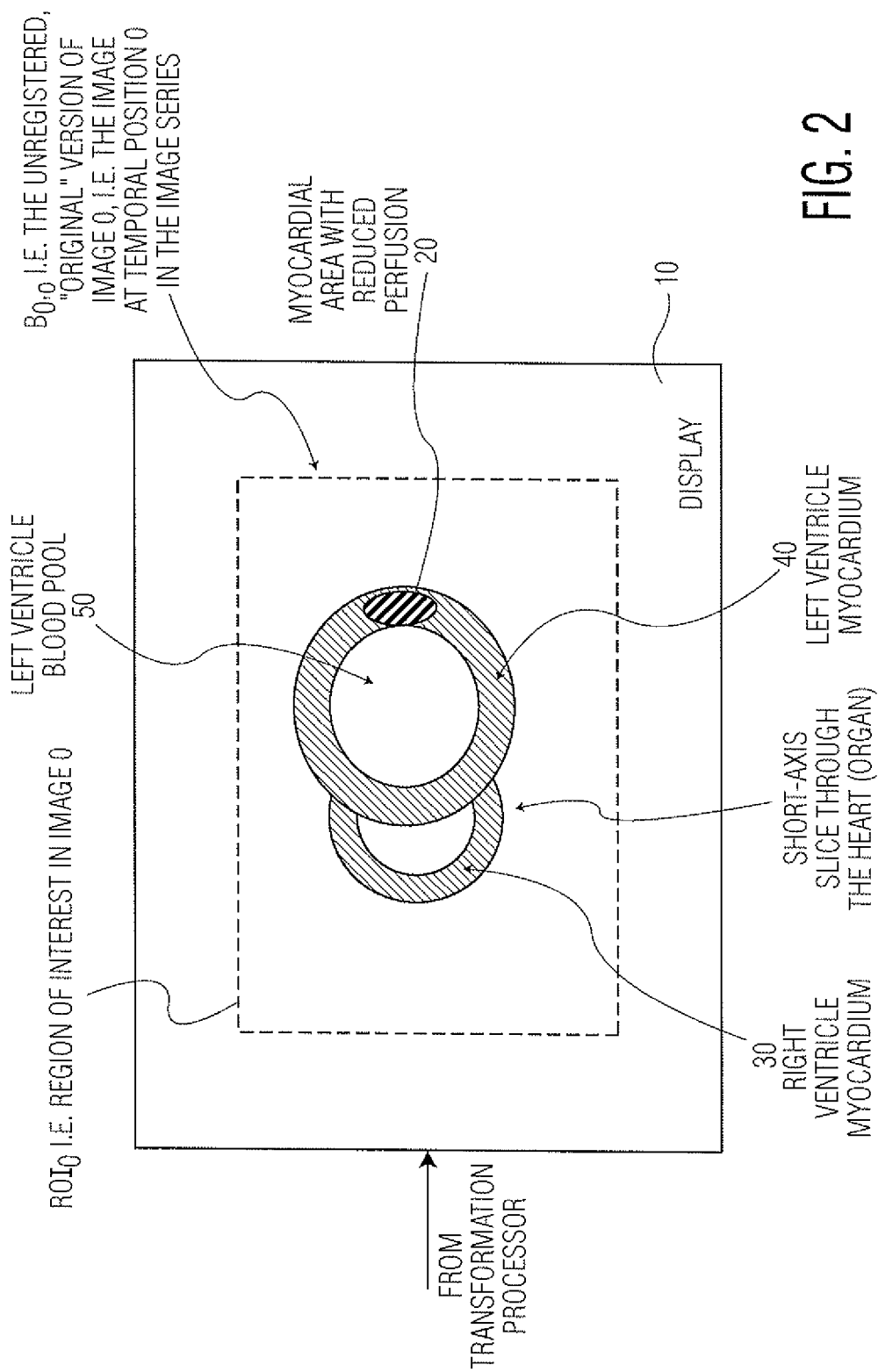
FIG. 2 is a pictorial representation of a display device displaying a region of interest in a first image of a sequence depicting a slice of a cardiac organ under perfusion investigation.
Figure 3:
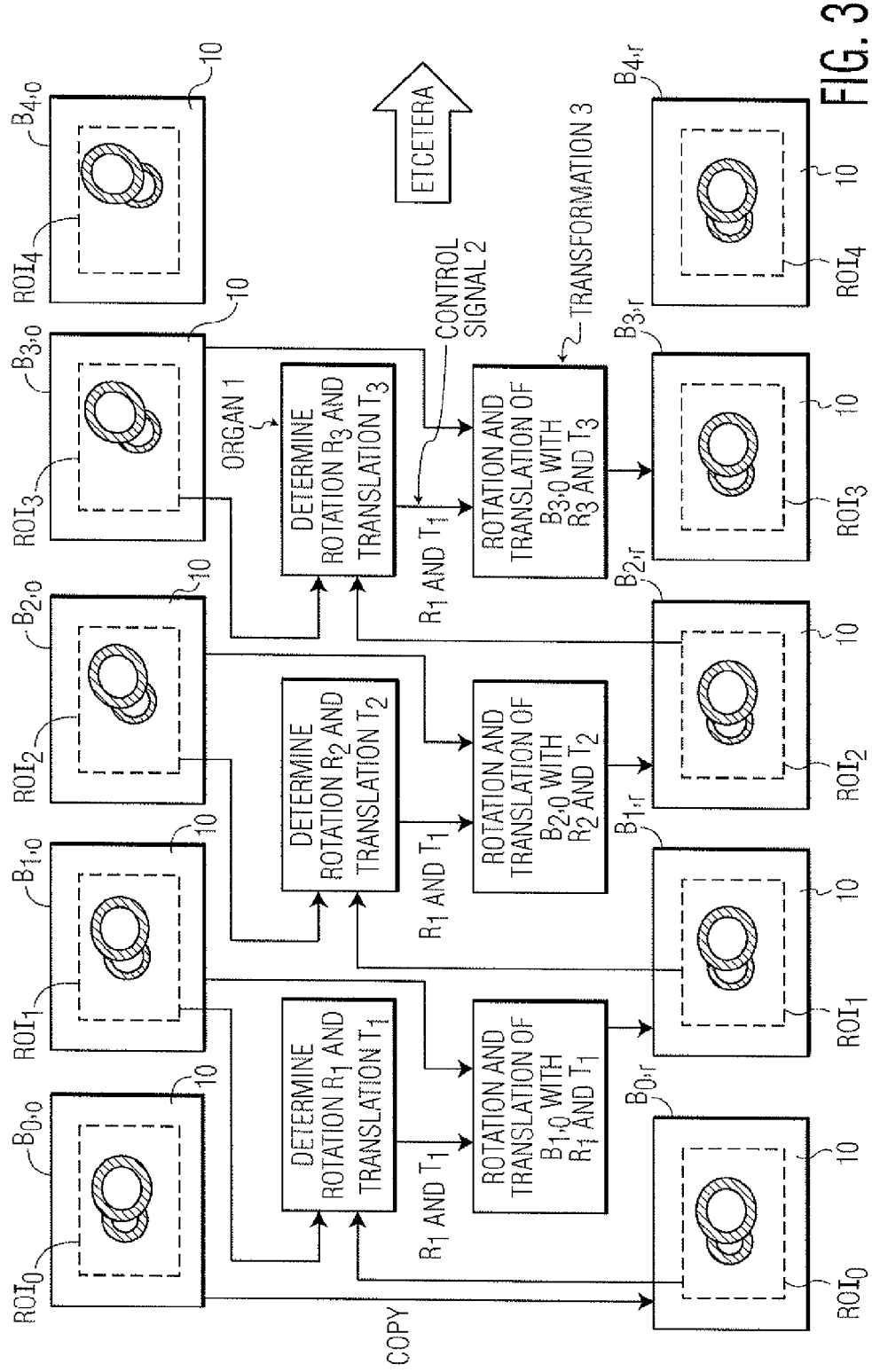
FIG. 3 is a series of succeeding images in time of a fixed position of a slice of a cardiac organ under investigation.
Figure 4:
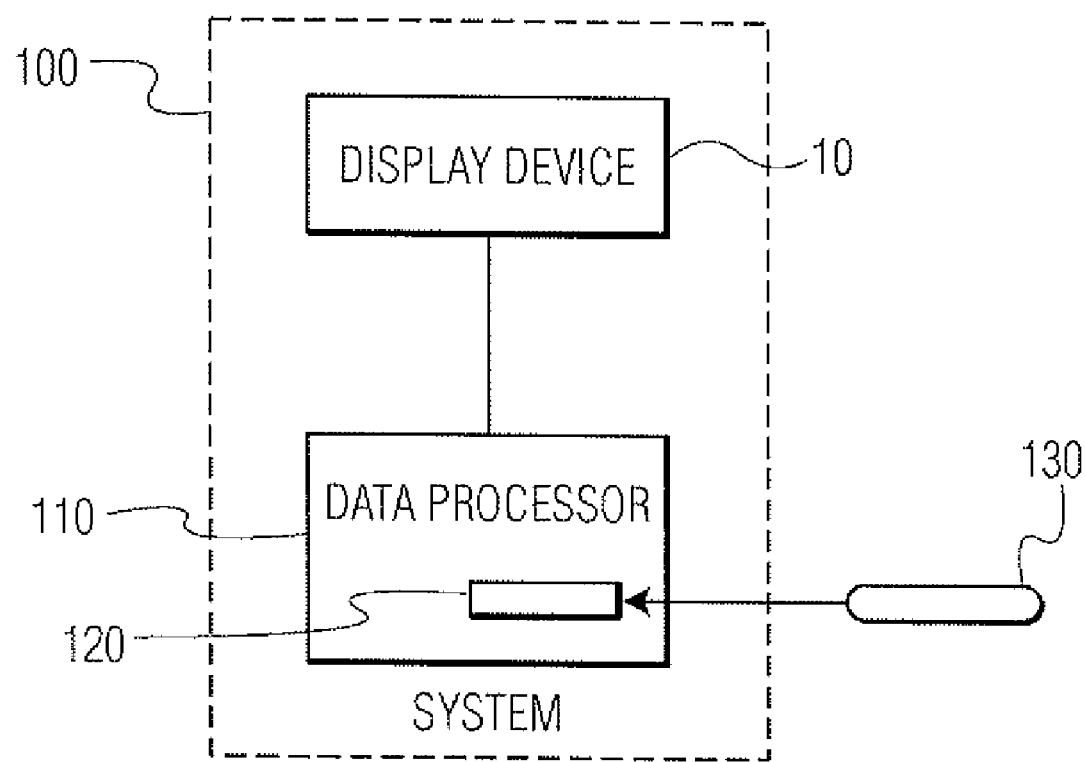
FIG. 4 is a data processing system of this invention.

An image $B_{i,r}$ that succeeds the image $B_{i-1,r}$ and bears the sequence number i is then determined as follows. This operation is based on an image $B_{i,o}$ that succeeds a previous image $B_{i-1,o}$, after which a reference region $ROI_i$ is defined in said image $B_{i,o}$, which reference region is bounded in the same way as the reference image $ROI_{i-1}$ in the image $B_{i-1,r}$. The two reference regions $ROI_{i-1}$ and $ROI_i$ are subsequently analyzed in a calculation processor 1 in order to determine the degree of rotation and translation of $ROI_i$ relative to $ROI_{i-1}$ that is necessary so as to minimize the differences between $ROI_{i-1}$ and $ROI_i$; (due to spurious organ motion). To this end, the calculation processor 1 generates and applies a control signal 2 to a transformation processor 3 which performs a rotation and/or translation on the entire image $B_{i,o}$ in order to obtain the image $B_{i,r}$ that can subsequently be presented (based on control signal on control signal 2). That is, $B_{i,o}$, coming sequentially in time after the image $B_{i-1,r}$, is displayed on a display device 10 for visual inspection (FIGS. 2-4).

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A system for visualizing perfusion behavior of an organ, the system comprising:
   a processor programmed to:
      for each image in a series of images acquired in temporal succession, determine a transform that minimizes positional differences between a reference region in the immediate vicinity of the organ in each image and the same reference region in an immediately preceding image of the series of images,
      operate on each image with the corresponding determined transform such that the reference region in each image is transformed to a common position,
      analyze the series of images with the reference region in the common position to determine the perfusion behavior of the organ; and,
   a display on which at least one of a visualization of the perfusion behavior and the series of images is displayed.

2. A method of visualizing perfusion behavior of an organ, the method comprising:
   acquiring a series of images which contain the organ;
   determining a reference region in each image of the series;
   for each image of the series, determining a transform that minimizes positional differences between the reference region in said each image and the reference region in a preceding reference image wherein the reference image is an immediately preceding image;
   operating on each image with the determined transform that minimizes the differences between the reference regions of said each image and the preceding reference image such that the reference region of image is transformed to a common position in each image;
   determining a perfusion measurement of the organ; and
   displaying the perfusion measurement.

3. The method according to claim 2, wherein the determined transform that minimizes the differences between the reference regions of each image and the reference image operates on the entire each image.

4. The method according to claim 2, further including:
   displaying each image of the series with the reference region in the common position.

5. The method according to claim 2, wherein the transform is limited to translation and rotation.

6. The method according to claim 2, wherein acquiring the series of images includes:
   magnetic resonance imaging a subject that has been injected with a contrast liquid that facilitates perfusion measurement.

7. The method according to claim 6, wherein the perfusion measurement is determined from intensity variation of the injected contrast liquid in successive images.

8. The method according to claim 7, wherein the series of images are displayed serially with the reference region in the common position for visual inspection enabling analysis of the perfusion behavior of the organ to be examined.

9. A computer readable medium which includes a computer program transferrable to a general purpose computer to control the general purpose computer to implement the method according to claim 2.

10. A method of visualizing perfusion behavior of an organ, the method comprising:
    performing a transformation generation on every pair of successive images from a series of images of the organ in such a manner that subsequent to the transformation, the organ is displayed in a common position in each image,
    the transform operation being determined from a reference region in the immediate vicinity of the organ in the images of the series such that the perfusion behavior of the organ can be visualized while other less important parts of the images arc subject to displacement from image to image.

11. A computer readable medium carrying a computer program for controlling a computer to perform the method according to claim 10.

12. A system for visualizing perfusion behavior of an organ comprising:
    a processor programmed to perform the method of claim 10; and,
    a display for displaying at least one of the perfusion behavior and the series of images.

* * * * *